(12) United States Patent
Wang

(10) Patent No.: US 12,671,385 B2
(45) Date of Patent: Jun. 30, 2026

(54) BROADBAND BALUN STRUCTURES AND APPLICATIONS THEREOF

(71) Applicant: NANKAI UNIVERSITY, Tianjin (CN)

(72) Inventor: Xudong Wang, Tianjin (CN)

(73) Assignee: NANKAI UNIVERSITY, Tianjin (CN)

( * ) Notice: Subject to any disclaimer, the term of this patent is extended or adjusted under 35 U.S.C. 154(b) by 110 days.

(21) Appl. No.: 18/764,358

(22) Filed: Jul. 4, 2024

(65) Prior Publication Data

US 2025/0047255 A1     Feb. 6, 2025

Related U.S. Application Data

(63) Continuation of application No. PCT/CN2023/123361, filed on Oct. 8, 2023.

(30) Foreign Application Priority Data

Aug. 2, 2023     (CN) .......................... 202310964456.9

(51) Int. Cl.
| | |
|---|---|
| *H03H 7/42* | (2006.01) |
| *H01F 30/02* | (2006.01) |
| *H03H 7/09* | (2006.01) |
| *H03H 1/00* | (2006.01) |

(52) U.S. Cl.
CPC .............. *H03H 7/42* (2013.01); *H01F 30/02* (2013.01); *H03H 7/09* (2013.01); *H03H 2001/0085* (2013.01)

(58) Field of Classification Search
CPC ............. H03H 7/09; H03H 7/42; H01F 30/02

USPC .................................. 333/177, 185; 336/200
See application file for complete search history.

(56) References Cited

U.S. PATENT DOCUMENTS

| | | | |
|---|---|---|---|
| 6,572,287 B1* | 6/2003 | Thuis ........................ | H03H 7/38 |
| | | | 323/370 |
| 2013/0022133 A1 | 1/2013 | Knierim et al. | |
| 2014/0273814 A1* | 9/2014 | Ralph .................. | H03D 7/1425 |
| | | | 455/12.1 |
| 2016/0020733 A1* | 1/2016 | Kaehs ..................... | H03F 3/245 |
| | | | 330/262 |

(Continued)

FOREIGN PATENT DOCUMENTS

| | | |
|---|---|---|
| CN | 106100602 A | 11/2016 |
| CN | 113411063 A | 9/2021 |
| CN | 115529017 A | 12/2022 |

(Continued)

*Primary Examiner* — Rakesh B Patel
(74) *Attorney, Agent, or Firm* — PORUS IP LLC

(57)     ABSTRACT

The present disclosure provides a new broadband balun structure, comprising an inverting transformer and an autotransformer; wherein the inverting transformer is configured to invert an input signal to generate an inverting signal; the autotransformer is configured to divide the input signal to generate an in-phase signal; at least one of one end of the inverting transformer or one end of the autotransformer is connected to an unbalanced end; the inverting transformer is connected to the autotransformer when the one end of the inverting transformer or the autotransformer is connected to the input signal of the unbalanced end; and the other end of the inverting transformer is used as an inverting signal end of a balanced end, and the other end of the autotransformer is used as an in-phase signal end of the balanced end.

14 Claims, 10 Drawing Sheets

(56)             References Cited

U.S. PATENT DOCUMENTS

2020/0220516 A1      7/2020   Lin et al.

FOREIGN PATENT DOCUMENTS

| | | | |
|---|---|---|---|
| CN | 116799463 | A | 9/2023 |
| JP | H07202523 | A | 8/1995 |
| WO | 2023020097 | A1 | 2/2023 |

* cited by examiner

Unbalanced
End

Balanced End

--Prior Art--

Unbalanced End

Balanced End

--Prior Art--

$Re=2*Zo$
Balanced End $Ra=\frac{1}{2}*Zo$

--Prior Art--

BROADBAND BALUN STRUCTURES AND APPLICATIONS THEREOF

CROSS-REFERENCE TO RELATED APPLICATIONS

This application is a Continuation of International Application No. PCT/CN2023/123361, filed on Oct. 8, 2023, which claims priority to Chinese Patent Application No. 202310964456.9, filed on Aug. 2, 2023, the entire contents of which are hereby incorporated by reference.

TECHNICAL FIELD

The present disclosure relates to the technical field of balun bandwidth, and in particular relates to a new broadband balun structure and an application thereof.

BACKGROUND

A balun is an important device for converting a single-ended signal to a balanced signal, which is widely used in radio frequency, microwave, and millimeter-wave wireless and radio communications, instrumentation, and measurement systems. There are many types of balun structures available, including a transformer balun (a voltage-type balun), a current-type balun (a GUANELLA-type balun), a Marchand-type balun, a Ruthroff-type balun, an autotransformer-based balun, or the like. These baluns have limitations in bandwidth and impedance conversion. Particularly, when flexible impedance transformations are required and need to operate at broadband, the structures are either overly complex or difficult to implement.

Therefore, providing a new broadband balun structure and an application thereof helps to realize a wider bandwidth and at the same time allows flexible impedance transformation.

SUMMARY

One or more embodiments of the present disclosure provide a new broadband balun structure, comprising an inverting transformer and an autotransformer; wherein the inverting transformer is configured to invert an input signal to generate an inverting signal; the autotransformer is configured to divide the input signal to generate an in-phase signal; at least one of one end of the inverting transformer or one end of the autotransformer is connected to an unbalanced end; the inverting transformer is connected to the autotransformer when the one end of the inverting transformer or the autotransformer is connected to the input signal of the unbalanced end; and the other end of the inverting transformer is used as an inverting signal end of the balanced end, and the other end of the autotransformer is used as an in-phase signal end of the balanced end.

One or more embodiments of the present disclosure provide an application of a new broadband balun structure including two new broadband balun structures, wherein the application comprises: connecting the in-phase signal end and the inverting signal end of one of the new broadband balun structures to input ends of two amplifiers, respectively, and connecting output ends of the two amplifiers to the balanced end of another one of the new broadband balun structures.

One or more embodiments of the present disclosure provide an application of a new broadband balun structure including two new broadband balun structures, wherein the application comprises: connecting the in-phase signal end and the inverting signal end of one of the new broadband balun structures to a mixer, respectively, and connecting an output end of the mixer to the balanced end of another one of the new broadband balun structures.

BRIEF DESCRIPTION OF THE DRAWINGS

This description will be further explained in the form of exemplary embodiments, which will be described in detail by means of accompanying drawings. These embodiments are not restrictive, in which the same numbering indicates the same structure, wherein.

DETAILED DESCRIPTION

Figure 1:
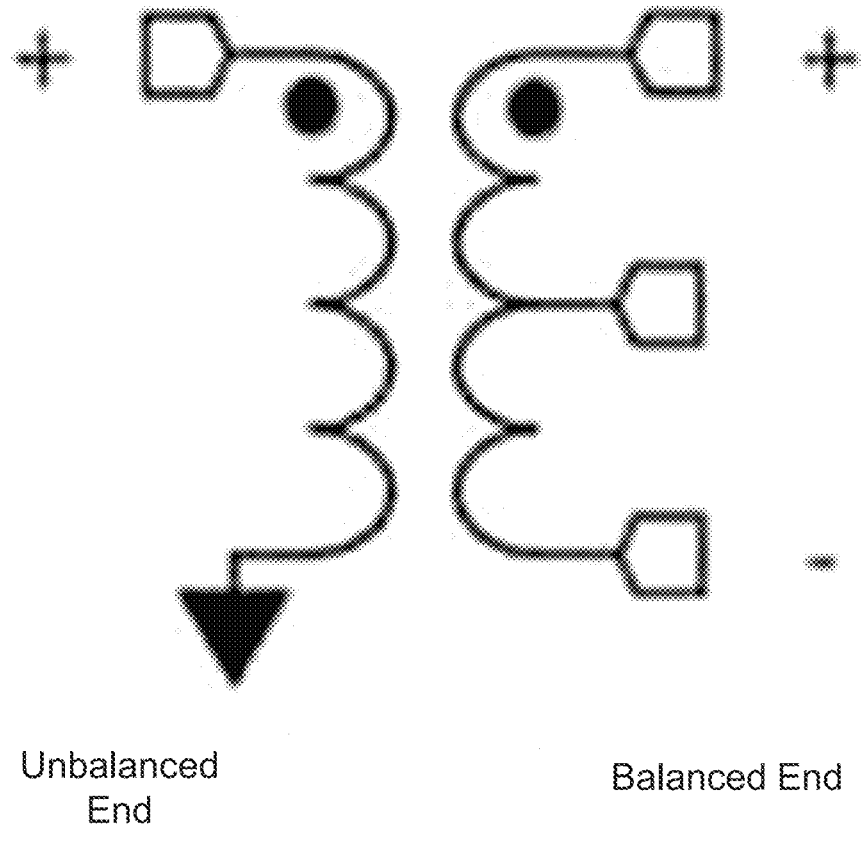
FIG. 1 is a schematic diagram illustrating a structure of a transformer balun in the background art according to some embodiments of the present disclosure.

The technical schemes of embodiments of the present disclosure will be more clearly described below, and the accompanying drawings need to be configured in the description of the embodiments will be briefly described below. Obviously, the drawings in the following description are merely some examples or embodiments of the present disclosure, and will be applied to other similar scenarios according to these accompanying drawings without paying creative labor. Unless obviously obtained from the context or the context illustrates otherwise, the same numeral in the drawings refers to the same structure or operation.

It should be understood that the terms "system", "device", "unit" and/or "module" used herein are a way to distinguish between different components, elements, parts, sections or assemblies at different levels. However, the words may be replaced by other expressions if other words accomplish the same purpose.

As shown in the present disclosure and the claims, unless the context clearly suggests an exception, the words "one," "a", "an", and/or "the" do not refer specifically to the singular, but may also include the plural. Generally, the terms "including" and "comprising" suggest only the inclusion of clearly identified steps and elements and do not constitute an exclusive list, the method or apparatus may also include other steps or elements.

Flowcharts are used in the present disclosure to illustrate operations performed by a system in accordance with embodiments of the present disclosure. It should be appreciated that the preceding or following operations are not necessarily performed in an exact sequence. Instead, steps may be processed in reverse order or simultaneously. Also, it is possible to add other operations to these processes, or to remove a step or steps from these processes.

Figure 2:
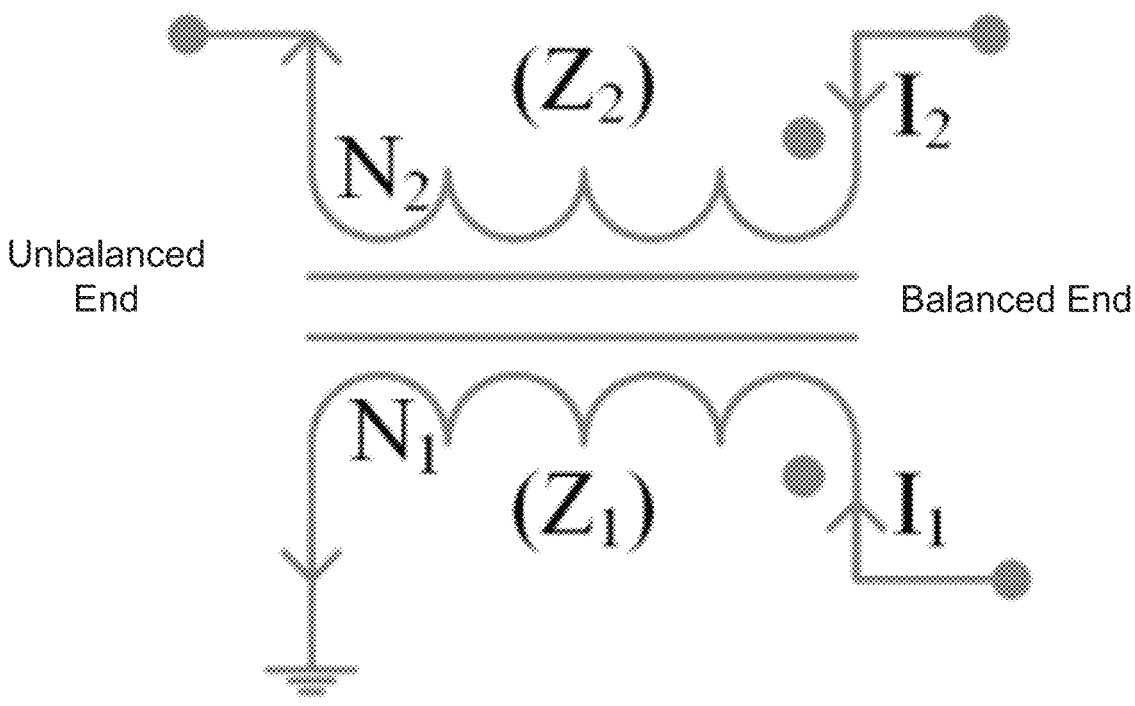
FIG. 2 is a schematic diagram illustrating a structure of a current-type balun in the background art according to some embodiments of the present disclosure.
Figure 3:
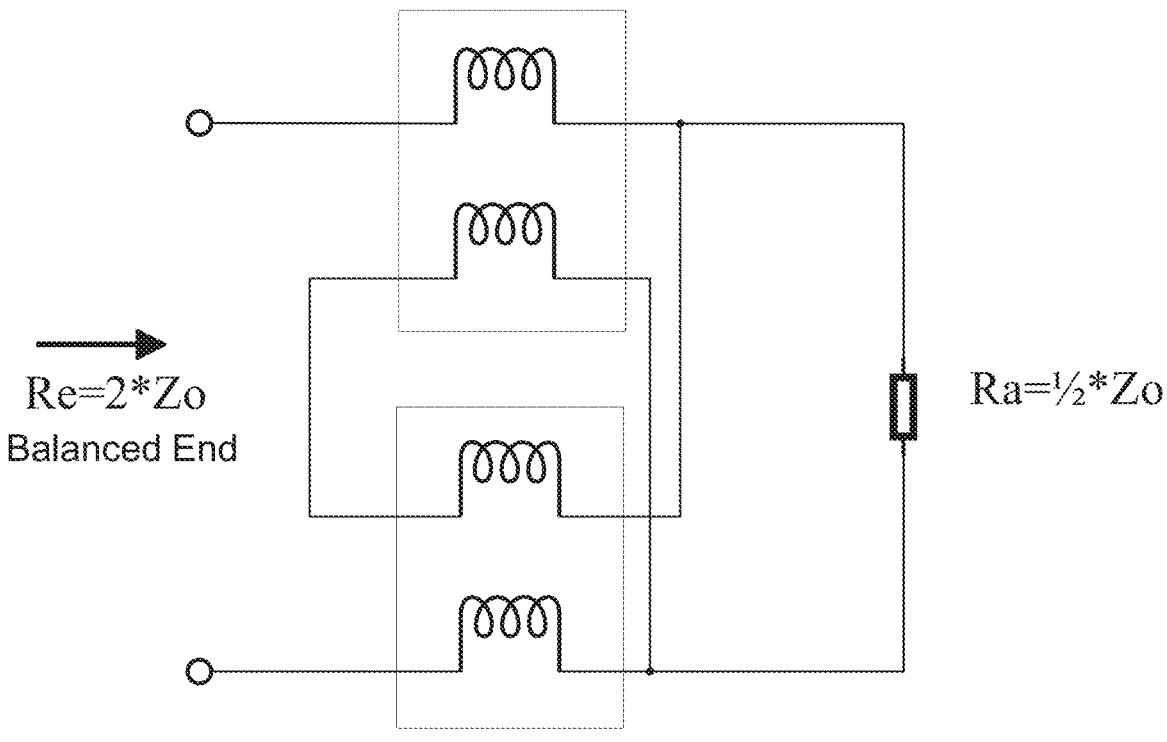
FIG. 3 is a schematic diagram illustrating a structure of another current-type balun in the background art according to some embodiments of the present disclosure.

FIG. 1 is a schematic diagram illustrating a structure of a transformer balun in the background art according to some embodiments of the present disclosure. As shown in FIG. 1, a bandwidth of a transformer balun is limited by a non-inverting transformer such that parasitic capacitance between a primary winding and a secondary winding, which leads to phase and amplitude imbalance. A GUANELLA-type balun has a very good bandwidth, and FIG. 2 is a schematic diagram illustrating a structure of a current-type balun in the background art according to some embodiments of the present disclosure. As shown in FIG. 2, the GUANELLA-type balun has an impedance ratio of 1:1. FIG. 3 is a schematic diagram illustrating a structure of another current-type balun in the background art according to some embodiments of the present disclosure. As shown in FIG. 3, the balun structure has an impedance ratio of is 4:1. A balun with an integer impedance ratio may be realized by connecting a plurality of GUANELLA-type baluns with a 1:1 impedance ratio connected in series and parallel. The above type of the balun structures still haves some problems, such as, it is not easy to realize the fractional impedance ratio, and the topology is more complicated except for the integer impedance ratios of 1:1 and 1:4. A Marchard-type balun is widely used as a broadband balun, however, its bandwidth is limited by a ¼-wavelength transmission line requirement of its topology, and the Marchard-type balun is used primarily in microwave and millimeter-wave applications. A Ruthroff-type balun with a 1:1 impedance ratio has a wider bandwidth than other balun topologies, but this balun structure may only achieve a fixed 1:1 impedance ratio.

In view of the foregoing, some embodiments of the present disclosure provide a new broadband balun structure and an application thereof, an in-phase signal is generated by an unbalanced end signal through a voltage divider function, and is kept in-phase with the input signal; an inverting signal is generated by an inverting transformer. The inverting transformer and the autotransformer may be realized by means of multi-layer metal vertical coupling, resulting in a smaller size and a simple structure. The parasitic capacitance or parasitic resistance has more optimization freedom in layout design optimization, and a better amplitude and phase balance may be achieved in a very wide bandwidth, and a better common-mode rejection effect may be achieved when applied to a balanced mixer and a push-pull amplifier.

Figure 4:
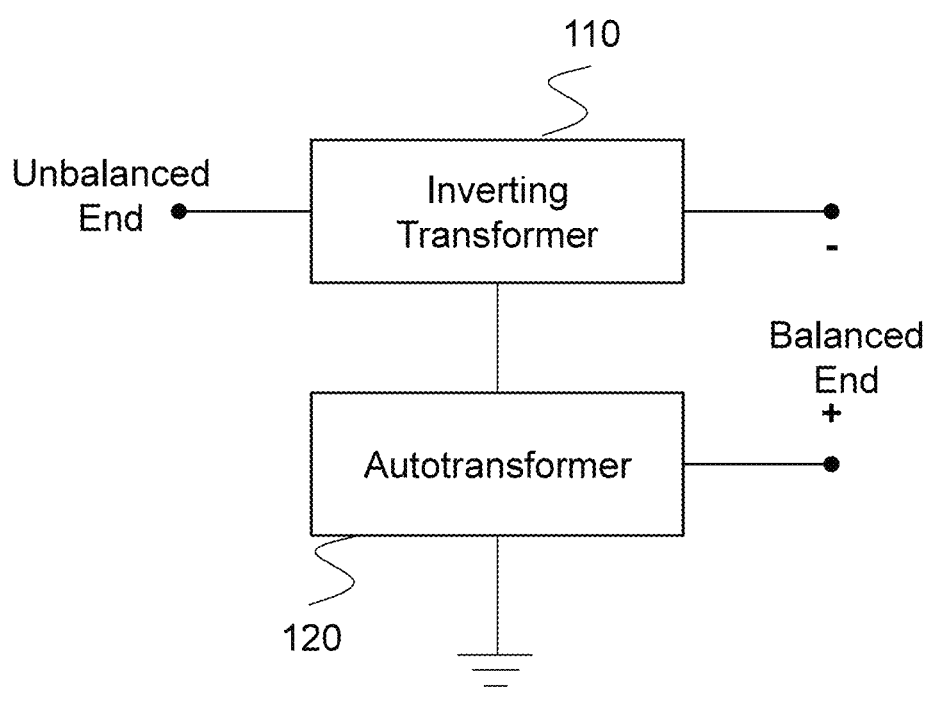
FIG. 4 is a schematic diagram illustrating a first structure of a new broadband balun structure according to some embodiments of the present disclosure.
Figure 5:
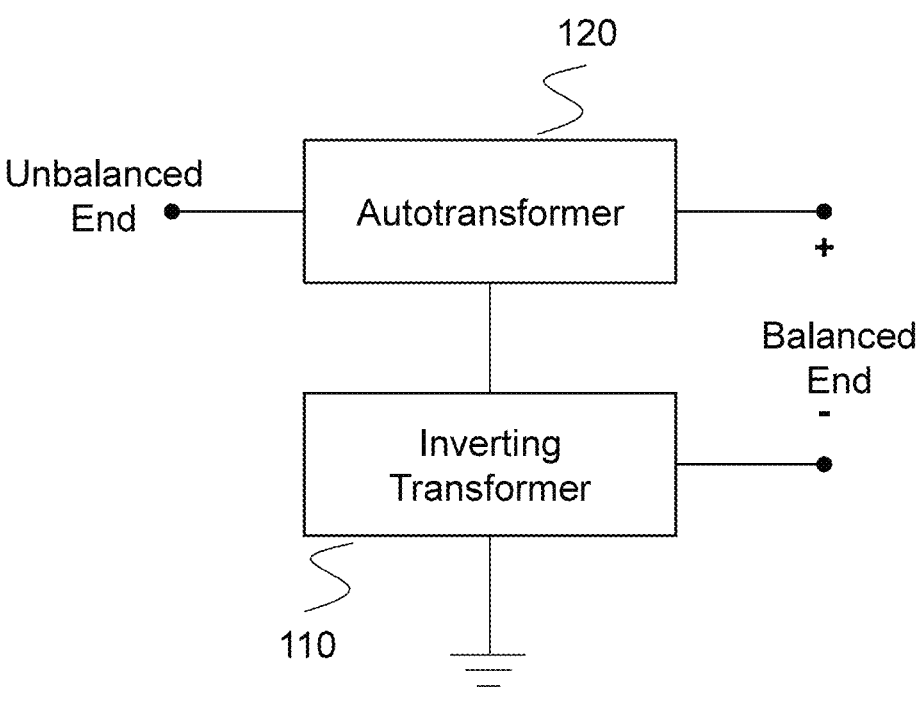
FIG. 5 is a schematic diagram illustrating a second structure of a new broadband balun structure according to some embodiments of the present disclosure.
Figure 6:
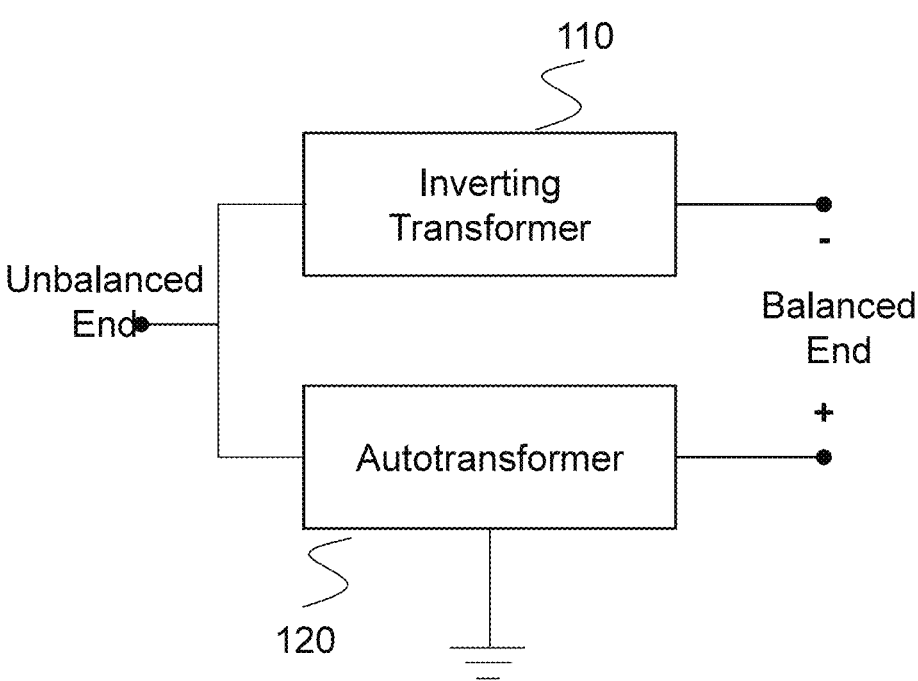
FIG. 6 is a schematic diagram illustrating a third structure of a new broadband balun structure according to some embodiments of the present disclosure.

FIG. 4 is a first schematic diagram illustrating a structure of a new broadband balun structure according to some embodiments of the present disclosure; FIG. 5 is a second schematic diagram illustrating a structure of a new broadband balun structure according to some embodiments of the present disclosure; FIG. 6 is a third schematic diagram illustrating a structure of a new broadband balun structure according to some embodiments of the present disclosure.

In some embodiments, as shown in FIGS. 4-6, a new broadband balun structure includes an inverting transformer 110 and an autotransformer 120.

In some embodiments, the new broadband balun structure may be configured to convert an unbalanced signal (a single-ended signal) to a balanced signal (a differential signal) and may also convert a balanced signal (a differential signal) to an unbalanced signal (a single-ended signal).

The unbalanced signal is a signal transmitted through an unbalanced end, e.g., a single-ended signal. The unbalanced end is an interface that uses one signal line and one ground line for signal transmission. The balanced signal is a signal that is transmitted through a balanced end, such as a differential signal. The balanced end is an interface that uses two signal lines (e.g., an inverting signal end (henceforth referred to as an inverting end) and an in-phase signal end (henceforth referred to as an in-phase end)) for signal transmission. The balanced signal has the property that the in-phase signal and the inverting signal have the same amplitude but with 180 degree phase difference.

The inverting transformer 110 is configured to invert an input signal to generate an inverting signal with a phase opposite to the input signal.

The autotransformer 120 is configured to divide the input signal to generate an in-phase signal that is typically smaller in amplitude, but the same phase as the input signal.

Exemplarily, taking a single-ended signal converted to a differential signal as an example: the unbalanced end is an input end, and the balanced end is an output end. The inverting transformer 110 is configured to invert the input signal of the unbalanced end, generating an inverting signal of the input signal; the autotransformer 120 is configured to divide the input signal of the unbalanced end, generating the in-phase signal of the input signal.

In some embodiments, one end of the inverting transformer 110 and/or the autotransformer 120 is connected to the unbalanced end; when one end of the inverting transformer 110 or the autotransformer 120 is connected to the unbalanced end of the input signal, the inverting transformer 110 connects the autotransformer 120; the other end of the inverting transformer 110 serves as an inverting signal end of the balanced end, and the other end of the autotransformer 120 serves as an in-phase signal end of the balanced end.

In some embodiments, one end of at least one of the inverting transformer and the autotransformer is electrically connected to the unbalanced end. When one end of the inverting transformer 110 or the autotransformer 120 is connected to the input signal of the unbalanced end, the other end of the inverting transformer 110 is connected to a corresponding end of the autotransformer 120; when one end of the inverting transformer 110 and one end of the autotransformer 120 are respectively connected to the input signal of the unbalanced end, the inverting transformer 110 and the autotransformer 120 are not directly connected.

In some embodiments, as shown in FIG. 4: a first end of the inverting transformer 110 is connected to the unbalanced end, a second end of the inverting transformer 110 is connected to a first end of the autotransformer 120, a third end of the inverting transformer 110 serves as the inverting signal end of the balanced end, a second end of the autotransformer 120 serves as the in-phase signal end of the balanced end, and a third end of the autotransformer 120 is connected to the ground. More information about this embodiment may be found in FIG. 7 and FIG. 8 and its related descriptions.

In some embodiments, the first end of the autotransformer 120 is connected to the unbalanced end, the third end of the autotransformer 120 is connected to the second end of the inverting transformer 110, the first end of the inverting transformer 110 is connected to the ground; as shown in FIG. 5, the third end of the inverting transformer 110 serves as the inverting signal end of the balanced end, and the second end of the autotransformer 120 serves as the in-phase signal end of the balanced end. More information about this embodiment may be found in FIG. 9 and its related description.

In some embodiments, as shown in FIG. 6, the first end of the inverting transformer 110 and the first end of the autotransformer 120 are connected to the unbalanced end respectively, and the second end of the inverting transformer 110 serves as the inverting signal end of the balanced end, and the second end of the autotransformer 120 serves as the in-phase signal end of the balanced end.

In some embodiments, the inverting transformer 110 includes a first inductor and a second inductor coupled together; and the autotransformer 120 includes a third inductor and a fourth inductor coupled together.

The first inductor is a portion of a coil that receives the input signal in the inverting transformer 110.

The second inductor is a portion of the coil located on the other side of the inverting transformer 110, connected to the first inductor by magnetic coupling and electrically isolated.

In some embodiments, the coupled together between the first inductor and the second inductor is achieved in various ways. For example, if the first inductor and the second inductor are wound in opposite directions (e.g., one winding is clockwise and the other is counterclockwise), a voltage induced in a coil of the second inductor may be 180 degrees out of phase with respect to a voltage of the first inductor.

The third inductor and the fourth inductor are different components of the same winding of the autotransformer 120, respectively. By using a part of winding turns as the third inductor (which may be regarded as a primary winding) and another part of the winding turns as the fourth inductor (which may be regarded as a secondary winding), there exists a common coil segment between both the primary and secondary windings so that the third inductor and the fourth inductor are coupled to each other by a magnetic field, and at the same time, the third inductor is electrically connected to the fourth inductor.

In some embodiments of the present disclosure, by means of the first inductor, the second inductor, the third inductor, and the fourth inductor, the structure may adjust the coupling coefficient, the number of turns, and other parameters of the inductors, realizing a flexible adaptation to different input impedance, output impedance requirements, and frequency response requirements, providing greater flexibility for the applicability of the structure and facilitating the optimization of circuit performance.

Figure 7:
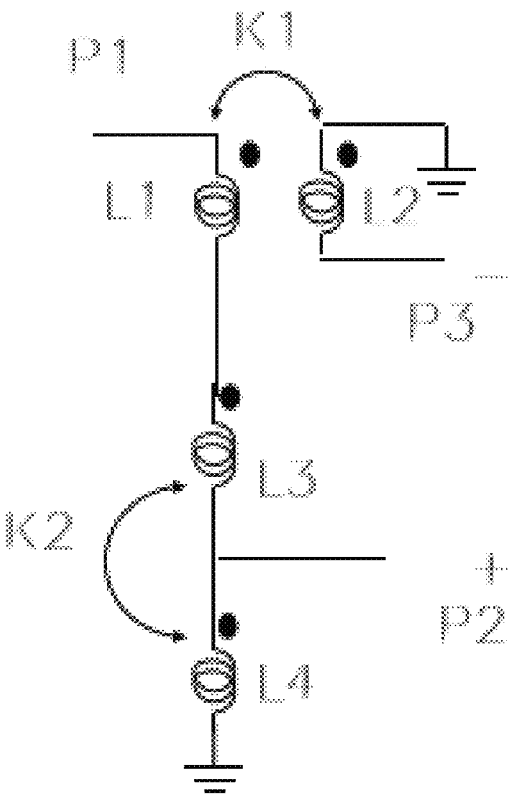
FIG. 7 is an exemplary schematic diagram illustrating a first circuit connection structure of a new broadband balun structure according to some embodiments of the present disclosure.

FIG. 7 is a first exemplary schematic illustrating a circuit connection structure of a new broadband balun structure according to some embodiments of the present disclosure.

In some embodiments, as shown in FIG. 7, taking a single-ended signal converted to a differential signal as an example: an unbalanced end P1 is an input end, and the balanced end is the output end (including an in-phase end P2, and an inverting end P3). A first end of a first inductor L1 of the inverting transformer 110 is connected to the unbalanced end P1, and a second end of the first inductor L1 is connected to a first end of a third inductor L3; a second end of the second inductor L2 is an opposite-name end to the first end of the first inductor L1, the second end of the second inductor L2 serves as the inverting end P3 of the balanced end, the first end of the second inductor L2 is a same-name end with the first end of the first inductor L1, and the first end of the second inductor L2 is connected to the ground; a second end of the third inductor L3 of the autotransformer 120 serves as the in-phase end P2 of the balanced end, the second end of the third inductor L3 is connected to a first end of the fourth inductor L4, and a second end of the fourth inductor L4 is connected to the ground. As shown in FIG. 7, ends where black dots of the first inductor L1 and the second inductor L2 are located indicates the same-name ends of the two inductors. Ends where black dots of the third inductor L3 and the fourth inductor L4 are located indicate the same-name ends of the two inductors.

More information about the inverting transformer and the autotransformer may be found in FIG. 4 and their related descriptions.

The same-name end and the opposite-name end are configured to mark the winding direction relationship between two coils coupled to each other. When a magnetic flux direction generated by the current passed through the two line diagrams is consistent, current inflow ends of the two coils are the same-name ends; when the magnetic flux direction generated by the current passed through the two line diagrams is inconsistent, the current inflow ends of the two coils are the opposite-name ends.

In some embodiments of the present disclosure, the connection of the first inductor, the second inductor ensures that the input signal is directly connected to the inverting signal end of the balanced end after inverting the phase of the input signal, which reduces unnecessary signal paths and reduces loss and potential interference; the third inductor, the fourth inductor not only as part of the autotransformer to participate in the voltage division of the input signal, at the same time, the third inductor and the fourth inductor may effectively reduce the common mode interference, improve the purity of the differential mode signal, and enhance the signal-to-noise ratio of the signal.

In some embodiments, in FIG. 7, the unbalanced end P1 is a high impedance and the balanced end is a low impedance, and a ratio of inductance values of the first inductor and the second inductor in the inverting transformer 110 is n:1, and a ratio of an inductance value of the third inductor in the autotransformer to a total inductance value formed by the third inductor and the fourth inductor is 1:n. n is an integer or fraction greater than 1. n is a parameter value that may be obtained by the system or manually preset, and n may also be determined according to actual situations.

Accurate impedance transformation may be realized by setting the ratio of the inductance values to convert a high impedance unbalanced signal to a low impedance balanced signal; and the input end of the high impedance helps reduce the effect of noise on the input signal, and the output end of the low impedance may provide a stable and balanced output signal, which is suitable for noise and interference suppression, or the like and may be used for impedance matching or to improve the nonlinear performance of the backplane circuit module.

In some embodiments, an impedance ratio of the unbalanced end P1 to the balanced end is n:1 in FIG. 7.

In some embodiments, an inductance value of the first inductor L1 is greater than an inductance value of the second inductor L2. For example, when a ratio of the inductance value of the first inductor L1 to the inductance value of the second inductor L2 in the inverting transformer 110 is 4:1; and when an inductance value of the third inductor L3 in the autotransformer 120 is equal to an inductance value of the fourth inductor L4, a coupling coefficient of the inverting transformer 110 is K1, a coupling coefficient of the auto-transformer 120 is K2, and K1=K2=1, then the impedance ratio of the unbalanced end P1 of the new broadband balun structure to the balanced end is 4:1.

In some embodiments, when the inductance value of the first inductor L1 is equal to the inductance value of the second inductor L2 and the inductance value of the third inductor L3 is zero, then the new broadband balun structure degenerates into a Ruthroff-type analog with an impedance ratio of 1:1 balun.

It should be noted that the circuit connection structure shown in FIG. 7 is illustrated as an example of converting a single-ended signal to a differential signal, and it may be understood that the structure may also be applied to converting a differential signal to a single-ended signal. That is, an application in which the balanced signal end is used as the input and the single-ended signal end is used as the output.

Figure 8:
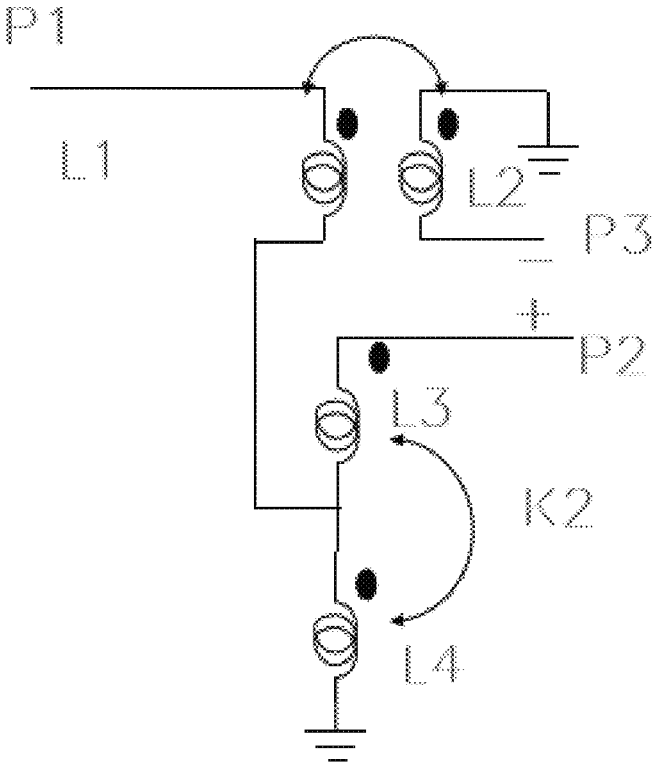
FIG. 8 is an exemplary schematic diagram illustrating a second circuit connection structure of a new broadband balun structure according to some embodiments of the present disclosure.

FIG. 8 is a second exemplary schematic diagram illustrating a circuit connection structure of a new broadband balun structure according to some embodiments of the present disclosure.

In some embodiments, as shown in FIG. 8, taking a single-ended converted to a differential signal as an example: the unbalanced end P1 is the input end, and the balanced end (including the in-phase end P2 and the inverting end P3) is the output end. The first end of the first inductor L1 is connected to the unbalanced end P1, the second end of the second inductor L2 is an opposite-name end to the first end of the first inductor L1, and the second end of the second inductor L2 is used as the inverting end P3 of the balanced end; the first end of the second inductor L2 is connected to the first end of the first inductor L1 and is a same-name end, and the first end of the second inductor L2 is connected to ground; the second end of the third inductor L3 is connected to the second end of the first inductor L1 and the first end of the fourth inductor L4, respectively, with the first end of the third inductor L3 acting as the in-phase end of the balanced end P2; and the second end of the fourth inductor L4 is connected to ground. As shown in FIG. 8, ends where black dots of the first inductor L1 and the second inductor L2 are located indicate the same-name ends of the two inductors. Ends where black dots of the third inductor L3 and the fourth inductor L4 are located indicate the same-name ends of the two inductors.

In some embodiments, in FIG. 8, the unbalanced end P1 is a low impedance, the balanced end is a high impedance, a ratio of inductance values of the first inductor L1 and the second inductor L2 is 1:n, and a ratio of an inductance value of the third inductor L3 to a total inductance value formed by the third inductor L3 and the fourth inductor L4 is 1:n.

More information about may be found in FIG. 7 and its related description.

By setting the unbalanced end to the low impedance and the balanced end to the high impedance, the input end of the low impedance helps to match the source impedance, while the output end of the high impedance helps to match the load impedance, which helps to improve the performance and stability of the circuit while reducing signal loss and inter-ference.

In some embodiments, the impedance ratio of the unbalanced end P1 to the balanced end is 1:n in FIG. 8.

In some embodiments, the inductance value of the first inductor L1 is less than the inductance value of the second inductor L2. For example, when the ratio of the inductance value of the first inductor L1 to the inductance value of the second inductor L2 in the inverting transformer 110 is 1:4;

and the inductance value of the third inductor L3 in the autotransformer 120 is equal to the inductance value of the fourth inductor L4, and K1=K2=1, then the impedance ratio of the unbalanced end to the balanced end of the new broadband balun structure is 1:4.

In some embodiments, when the inductance value of the first inductor L1 is equal to the inductance value of the second inductor L2, and the inductance value of the third inductor L3 is equal to zero, the new broadband balun structure is equivalently a Ruthroff-type analog with an impedance ratio of 1:1 balun.

It should be noted that the circuit connection structure shown in FIG. 8 is illustrated as an example of converting a single-ended signal to a differential signal, and it can be understood that the structure may also be applied to converting a differential signal to a single-ended signal.

Figure 9:
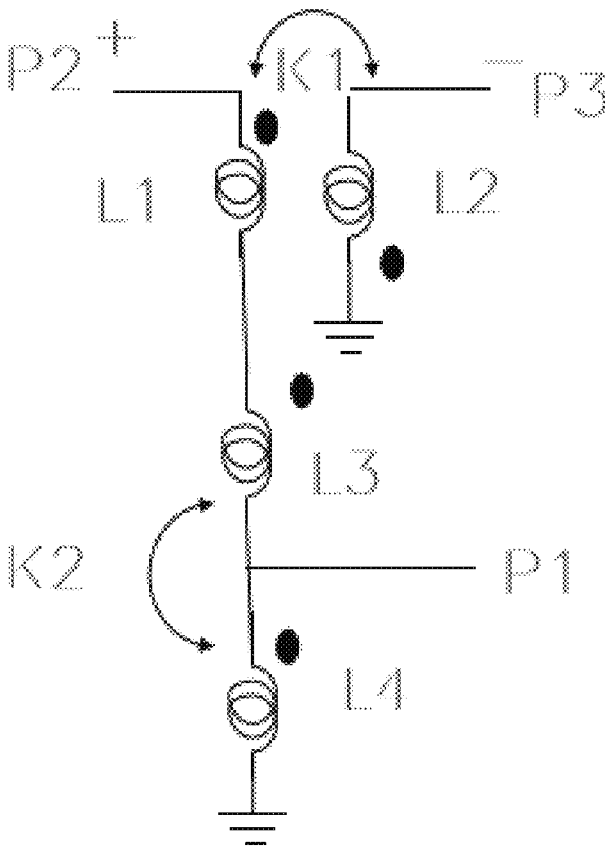
FIG. 9 is an exemplary schematic diagram illustrating a third circuit connection structure of a new broadband balun structure according to some embodiments of the present disclosure.

FIG. 9 is a third exemplary schematic diagram illustrating a circuit connection structure of a new broadband balun structure according to some embodiments of the present disclosure.

In some embodiments, the new broadband balun structure shown in FIG. 9, for example, converts a differential signal to a single-ended signal, the balanced end (including the in-phase end P2 and the inverting end P3) is the input end and the unbalanced end P1 is the output end, and the unbalanced end P1 is a low impedance and the balanced end is a high impedance. The autotransformer 120 is connected to the unbalanced end P1 as the output end, and an inverting transformer 110 is connected to the balanced end as the input end.

In some embodiments, the inverting transformer 110 includes a first inductor L1 and a second inductor L2 coupled together; the autotransformer 120 includes a third inductor L3 and a fourth inductor L4 coupled together; a connection point between the second end of the third induc-tor L3 and a first end of the fourth inductor L4 is used as the output port P1 of the unbalanced end, a second end of the fourth inductor L4 is connected to ground, a first end of the third inductor L3 is connected to a second end of the first inductor L1, and a first end of the first inductor L1 is used as an in-phase end of the balanced end P2, the first inductor L1 is coupled to the second inductor L2, a second end of the second inductor L2 is the same-name end as the first end of the first inductor L1, the second end of the second inductor L2 is connected to ground, a first end of the second inductor L2 is an opposite-name end to the first end of the first inductor L1, and the first end of the second inductor L2 serves as the inverting end P3 of the balanced end. As shown in FIG. 9, ends where black dots of the first inductor L1 and the second inductor L2 are located indicates the same-name ends of the two inductors. Ends where black dots of the third inductor L3 and the fourth inductor L4 are located indicates the same-name ends of the two inductors.

More information about the inverting transformer and the autotransformer may be found in FIG. 4 and its related descriptions.

It should be noted that the circuit connection structure shown in FIG. 9 is illustrated as an example of converting a differential signal to a single-ended signal, and it can be understood that the structure may also be applied to con-verting a single-ended signal to a differential signal.

In some embodiments, an inductance value of the third inductor L3 in FIG. 9 is equal to an inductance value of the fourth inductor L4.

In some embodiments of the present disclosure, a new broadband balun structure by converting a differential signal to a single-ended signal and realizing a flexible impedance transformation function simplifies the external components required for the conversion of the differential signal to the single-ended signal, making the system design more compact, reduces manufacturing cost and complexity, and improves system reliability and applicability.

Figure 10:
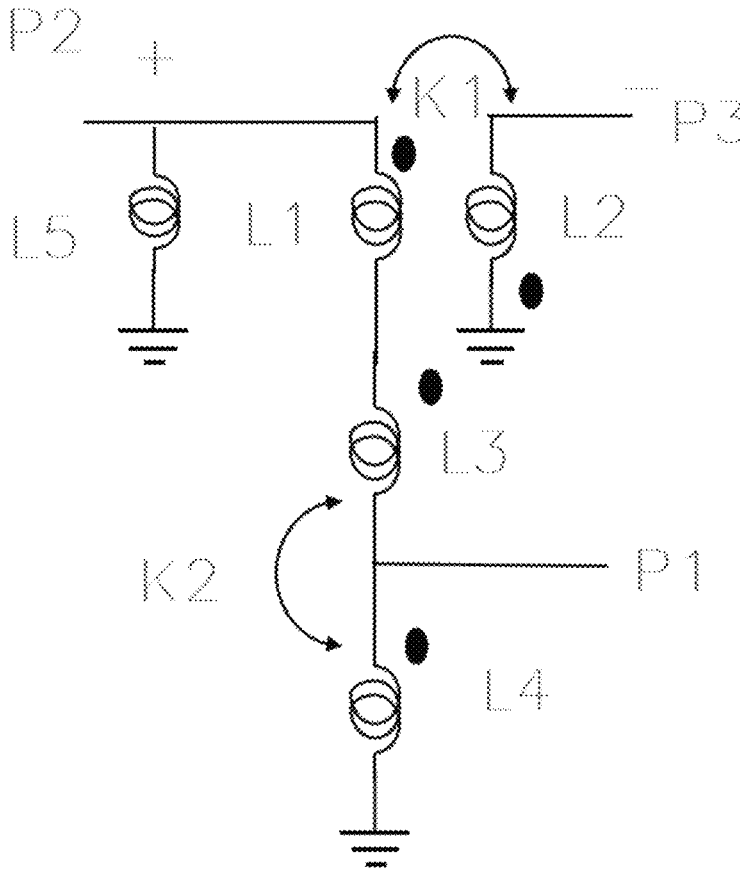
FIG. 10 is an exemplary schematic diagram illustrating a fourth circuit connection structure of a new broadband balun structure according to some embodiments of the present disclosure.

FIG. 10 is an exemplary schematic diagram IV of a circuit connection structure of a new broadband balun structure shown in accordance with some embodiments of the present disclosure.

In some embodiments, a fifth inductor L5 connected at an in-phase end is also included, with a first end of the fifth inductor L5 connected to the in-phase end and a second end connected to the ground. The inclusion of the fifth inductor L5 may improve amplitude and phase balancing performance to further expand the bandwidth of the balun. As shown in FIG. 10, on the basis of the circuit connection structure shown in FIG. 9, the first end of the first inductor L1 is also connected to the first end of the fifth inductor L5.

In the differential signal, an amplitude balance of the in-phase signal and the inverting signal is crucial for reducing distortion and improving signal quality. The impedance of the in-phase end of the broadband range may be adjusted through the adjustment of the inductance value of the fifth inductor, which is conducive to the realization of better matching impedance characteristics of the in-phase end and the inverting end; in a high-frequency signal transmission process, due to distribution capacitance, the inductor and other parasitic effects, the signal may experience phase shifts. The fifth inductor may be used as a compensation element. By precisely adjusting the inductance value of the fifth inductor, the phase shift caused by parasitic effects may be canceled out or corrected to ensure that the desired phase relationship is maintained between the in-phase end and the inverting end, such as a 180-degree phase difference.

In some embodiments, inductor centers of the inverting transformer 110 and the autotransformer 120 are embedded with magnetic core materials.

In some embodiments, the magnetic core material is made of a material with high magnetic permeability, such as ferrite, silicon steel sheet, or nickel-zinc ferrite. The magnetic core material may be of different shapes and structures, such as ring, E-shape, can, or customized shapes, and the shape and structure of the magnetic core material may be determined based on actual situations.

In some embodiments of the present disclosure, the magnetic core material may be configured to enhance the magnetic field strength in the inductor, thereby improving coupling efficiency and energy transfer capability.

In some embodiments, the inductors of the inverting transformer 110 and the autotransformer 120 are planar single-layer or multi-layer inductive structures in an integrated circuit process (IC) or a Low-Temperature Co-fired Ceramic (LTCC) process. For example, the inductance value of the inverting transformer 110 and/or autotransformer 120 (e.g., a planar spiral inductor or a microstrip inductor) may be implemented in the IC process by fabricating planar spiral-shaped conductive layers on a silicon chip; a plurality of the planar spiral-shaped inductors may be fabricated on different metal layers by multi-layer interconnection techniques in the IC process to increase the inductance value, and the inductance value may be optimized by adjusting a shape, a number of turns, a wire width and a spacing of the spiral. For example, the inverting transformer may be realized in the LTCC by printing coils on adjacent ceramic layers with windings oriented in the opposite direction; or, as another example, a coil may be designed in the LTCC in which the coil has different terminals on different layers to connect to external circuits, i.e., one part of the coil serves as a primary winding and the other part serves as a secondary winding, and there is a common coil segment between the primary winding and the secondary winding.

In some embodiments of the present disclosure, the IC and LTCC processes allow the inductors to be integrated on the same substrate as other electronic components (e.g., a capacitor, a resistor, a transistor, etc.), resulting in highly integrated electronic systems; at the same time, the planarized inductor structure may dramatically reduce the size and weight of the device, which is very important for applications such as portable electronic devices and aerospace.

In some embodiments of the present disclosure, traditional baluns may require multi-stage circuits or complex component layouts to achieve a good balance conversion effect, whereas by integrating the inverting transformer and the autotransformer structure it is possible to simplify design, reduce the number of components, reduce cost, and reduce the size of the device; the combined use of the inverting transformer and the autotransformer may realize the effective conversion of the input signal and the effective control of the phase, such as the inverting transformer may accurately invert the input signal, and at the same time the autotransformer generates an in-phase signal by dividing the input signal, which helps to improve the isolation between the balanced ends and effectively suppresses the common-mode noise, which helps to improve the signal quality.

The present disclosure also provides an application of a new broadband balun structure, including an application in a push-pull amplifier, a high IIP2 amplifier, or a high linearity amplifier; comprising two of the above new broadband balun structures, connecting an in-phase end and an inverting end of one of the new broadband balun structures to input ends of two amplifiers, respectively, and connecting output ends of the two amplifiers to the balanced ends of the other new broadband balun structure.

In some embodiments, in the application of a push-pull amplifier, a high IIP2 amplifier, or a high linearity amplifier including two amplifiers (e.g., a first amplifier, a second amplifier) and two new broadband balun structures (e.g., a first balun, a second balun), using an unbalanced end of the first balun as an input end and a balanced end of the first balun as an output end, an input end of the first amplifier is connected to an in-phase end of an output end of the first balun, and an input end of the second amplifier is connected to an inverting end of the output end of the first balun. With the balanced end of the second balun as an input end and the unbalanced end of the second balun as an output end, the output end of the first amplifier is connected to the in-phase end of the second balun, the output end of the second amplifier is connected to the inverting end of the second balun, and the unbalanced end of the second balun as the output end. The first balun is configured to convert the input single-ended signal into a first differential signal input to the amplifier, the first differential signal including a first signal input to the first amplifier and a second signal input to the second amplifier. The first amplifier is configured to amplify the first signal and output a first amplified signal, the second amplifier is configured to amplify the second signal and output a second amplified signal, the first amplified signal and the second amplified signal include a second differential signal input to the second balun, and the second balun is configured to convert the second differential signal to a single-ended signal and output the single-ended signal.

The present disclosure also provides an application of a new broadband balun structure for a broadband high linearity mixer (hereinafter referred to as a mixer) including two of the above-described new broadband balun structures, connecting the in-phase end and the inverting end of one of the new broadband balun structures to the mixer, respectively, and connecting an output end of the mixer to the balanced end of the another new broadband balun structure.

In some embodiments, when applied to the broadband high linearity mixer, a mixer and two new broadband balun structures (e.g., a third balun, a fourth balun) are included, an input end of the mixer includes two input ends (e.g., a first input end, a second input end), and an output end includes two output ends (e.g., a first output end, a second output end). The unbalanced end of the third balun is used as an input end and the balanced end of the third balun is used as an output end. The first input end and the second input end of the mixer are configured to receive the in-phase signal and the inverting signal, respectively, in the differential signal output from the third balun. For example, the third balun is configured to convert the input single-ended signal to the output differential signal, the in-phase end of the third balun is connected to the first input end of the mixer, the inverting end of the third balun is connected to the second input end of the mixer. The mixer is configured to mix the differential signal output by the third balun. In some embodiments, the balanced end of the fourth balun is used as an input end and the unbalanced end of the fourth balun is used as an output end. The first output end of the mixer is connected to the in-phase end of the fourth balun, and the second output end of the mixer is connected to the inverting end of the fourth balun, and the fourth balun is configured to further process the mixed signal by converting the input differential signal into the single-ended signal and output.

The mixer may have another end in addition to the input end and the output end, which connects to a local oscillator amplifier required for mixing. In some applications, the local oscillator amplifier is configured to amplify the input signal between the input signal of the end and the end of the mixer.

The basic concepts have been described above, apparently, in detail, as will be described above, and does not constitute limitations of the disclosure. Although there is no clear explanation here, those skilled in the art may make various modifications, improvements, and modifications of present disclosure. This type of modification, improvement, and corrections are recommended in present disclosure, so the modification, improvement, and the amendment remain in the spirit and scope of the exemplary embodiment of the present disclosure.

At the same time, present disclosure uses specific words to describe the embodiments of the present disclosure. As "one embodiment", "an embodiment", and/or "some embodiments" means a certain feature, structure, or characteristic of at least one embodiment of the present disclosure. Therefore, it is emphasized and should be appreciated that two or more references to "an embodiment" or "one embodiment" or "an alternative embodiment" in various parts of present disclosure are not necessarily all referring to the same embodiment. Further, certain features, structures, or features of one or more embodiments of the present disclosure may be combined.

In addition, unless clearly stated in the claims, the order of processing elements and sequences, the use of numbers and letters, or the use of other names in the present disclosure are not used to limit the order of the procedures and methods of the present disclosure. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. However, this disclosure does not mean that the present disclosure object requires more features than the features mentioned in the claims. Rather, claimed subject matter may lie in less than all features of a single foregoing disclosed embodiment.

In some embodiments, the numbers expressing quantities of ingredients, properties, and so forth, used to describe and claim certain embodiments of the application are to be understood as being modified in some instances by the term "about," "approximate," or "substantially". Unless otherwise stated, "about," "approximate," or "substantially" may indicate ±20% variation of the value it describes. Accordingly, in some embodiments, the numerical parameters used in the specification and claims are approximate values, and the approximation may change according to the characteristics required by the individual embodiments. In some embodiments, the numerical parameter should consider the prescribed effective digits and adopt a general digit retention method. Although in some embodiments, the numerical fields and parameters used to confirm the breadth of its range are approximate values, in specific embodiments, such numerical values are set as accurately as possible within the feasible range.

With respect to each patent, patent application, patent application disclosure, and other material cited in the present disclosure, such as articles, books, manuals, publications, documents, etc., the entire contents thereof are hereby incorporated by reference into the present disclosure. Application history documents that are inconsistent with the contents of the present disclosure or that create conflicts are excluded, as are documents (currently or hereafter appended to the present disclosure) that limit the broadest scope of the claims of the present disclosure. It should be noted that in the event of any inconsistency or conflict between the descriptions, definitions, and/or use of terms in the materials appended to the present disclosure and those described in the present disclosure, the descriptions, definitions, and/or use of terms in the present disclosure shall prevail.

At last, it should be understood that the embodiments described in the present disclosure are merely illustrative of the principles of the embodiments of the present disclosure. Other modifications that may be employed may be within the scope of the present disclosure. Thus, by way of example, but not of limitation, alternative configurations of the embodiments of the present disclosure may be utilized in accordance with the teachings herein. Accordingly, embodiments of the present disclosure are not limited to that precisely as shown and described.

What is claimed is:

1. A new broadband balun structure, comprising an inverting transformer and an autotransformer wherein:

the inverting transformer is configured to invert an input signal to generate an inverting signal;

the autotransformer is configured to divide the input signal to generate an in-phase signal;

at least one of one end of the inverting transformer or one end of the autotransformer is connected to an unbalanced end; the inverting transformer is connected to the autotransformer when the one end of the inverting transformer or the autotransformer is connected to the input signal of the unbalanced end; and the other end of the inverting transformer is used as an inverting signal end of a balanced end, and the other end of the autotransformer is used as an in-phase signal end of the balanced end.

2. The structure of claim 1, wherein the inverting transformer includes a first inductor and a second inductor coupled together; the autotransformer includes a third inductor and a fourth inductor, and the third inductor and the fourth inductor are different components of a same winding of the autotransformer; wherein:

the first inductor and the second inductor are coupled to each other through a magnetic field to form the inverting transformer; the third inductor and the fourth inductor are coupled to each other through a magnetic field to form the autotransformer, and when the one end of the inverting transformer or the autotransformer is connected to the input signal of the unbalanced end, one end of the third inductor of the autotransformer is connected to one end of the first inductor of the inverting transformer.

3. The structure of claim 2, wherein a first end of the first inductor of the inverting transformer is connected to the unbalanced end, a second end of the first inductor is connected to a first end of the third inductor; a second end of the second inductor and the first end of the first inductor are opposite-name ends, the second end of the second inductor is connected to the inverting signal end of the balanced end, and a first end of the second inductor and the first end of the first inductor are same-name ends, the first end of the second inductor is connected to ground; a second end of the third inductor is connected to the in-phase signal end of the balanced end and a first end of the fourth inductor, respectively, and a second end of the fourth inductor is connected to ground.

4. The structure of claim 2, wherein a first end of the first inductor is connected to the unbalanced end, a second end of the second inductor and a first end of the first inductor are opposite-name ends, the second end of the second inductor is connected to the inverting signal end of the balanced end, and a first end of the second inductor and the first end of the first inductor are same-name ends, the first end of the second inductor is connected to ground; a second end of the third inductor is connected to a second end of the first inductor and a first end of the fourth inductor, respectively, a first end of the third inductor is connected to the in-phase signal end of the balanced end; and a second end of the fourth inductor is connected to ground.

5. The structure of claim 2, wherein the unbalanced end is a connection point between a second end of the third inductor and a first end of the fourth inductor, a second end of the fourth inductor is connected to ground, a first end of the third inductor is connected to a second end of the first inductor, a first end of the first inductor is connected to the in-phase signal end of the balanced end, a second end of the second inductor and the first end of the first inductor are same-name ends, the second end of the second inductor is connected to ground, and a first end of the second inductor and the first end of the first inductor are opposite-name ends, the first end of the second inductor is connected to the inverting signal end of the balanced end.

6. The structure of claim 2, wherein the unbalanced end is high impedance, the balanced end is low impedance, a impedance ratio of the first inductor to the second inductor is n:1, and a ratio of a inductance value of the third inductor to a total inductance value formed by the third inductor and the fourth inductor is 1:n.

7. The structure of claim 6, wherein an impedance ratio of the unbalanced end to the balanced end is n:1.

8. The structure of claim 2, wherein the unbalanced end is low impedance and the balanced end is high impedance, an impedance ratio of the first inductor to the second inductor is 1:n, and a ratio of an inductance value of the third inductor to a total inductance value formed by the third inductor and the fourth inductor is 1:n.

9. The structure of claim 8, wherein an impedance ratio of the unbalanced end to the balanced end is 1:n.

10. The structure of claim 1, further comprising a fifth inductor connected to the in-phase signal end of the balanced end, wherein one end of the fifth inductor is connected to the in-phase signal end and the other end is connected to ground.

11. The structure of claim 1, wherein inductor centers of the inverting transformer and the autotransformer are embedded in magnetic core materials.

12. The structure of claim 1, wherein each of inductances of the inverting transformer and the autotransformer is a planar single-layer structure or multi-layer inductive structure in an integrated circuit process or a low temperature co-fired ceramic (LTCC) process.

13. An application of a new broadband balun structure including two new broadband balun structures as claim 1, wherein the application comprises: connecting the in-phase signal end and the inverting signal end of one of the new broadband balun structures to input ends of two amplifiers, respectively, and connecting output ends of the two amplifiers to the balanced end of another one of the new broadband balun structures.

14. An application of a new broadband balun structure including two new broadband balun structures as claim 1, wherein the application comprises: connecting the in-phase signal end and the inverting signal end of one of the new broadband balun structures to a mixer, respectively, and connecting an output end of the mixer to the balanced end of another one of the new broadband balun structures.

* * * * *